United States Patent
Tong et al.

(10) Patent No.: US 9,019,731 B2
(45) Date of Patent: Apr. 28, 2015

(54) HIGH-POWER MEDIUM-VOLTAGE DRIVE POWER CELL HAVING POWER ELEMENTS DISPOSED ON BOTH SIDES OF BASE PLATE

(75) Inventors: Ai-Xing Tong, Shanghai (CN); Yu-Ming Chang, Shanghai (CN); Hong-Jian Gan, Shanghai (CN); Shao-Cai Ma, Shanghai (CN); Jian-Ping Ying, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 590 days.

(21) Appl. No.: 13/415,480

(22) Filed: Mar. 8, 2012

(65) Prior Publication Data

US 2013/0100716 A1   Apr. 25, 2013

(30) Foreign Application Priority Data

Oct. 19, 2011 (CN) .......................... 2011 1 0318870

(51) Int. Cl.
*H02M 5/45* (2006.01)
*H02M 1/32* (2007.01)
*H05K 7/20* (2006.01)
*H02M 5/458* (2006.01)
*H02M 7/00* (2006.01)

(52) U.S. Cl.
CPC ............. *H02M 1/32* (2013.01); *H05K 7/20936* (2013.01); *H02M 5/458* (2013.01); *H02M 7/003* (2013.01); *H02M 2001/325* (2013.01)

(58) Field of Classification Search
USPC ............ 363/37, 39, 46, 65–70, 132, 133, 141
See application file for complete search history.

(56) References Cited

U.S. PATENT DOCUMENTS

| | | | | |
|---|---|---|---|---|
| 4,581,795 A | * | 4/1986 | Mobbs et al. | 29/25.42 |
| 6,972,972 B2 | * | 12/2005 | Duncan et al. | 363/56.01 |
| 7,032,695 B2 | * | 4/2006 | Beihoff et al. | 180/65.1 |
| 7,518,886 B1 | * | 4/2009 | Lai et al. | 363/17 |
| 7,583,136 B2 | * | 9/2009 | Pelly | 327/551 |
| 7,830,689 B2 | * | 11/2010 | Nakamura et al. | 363/141 |
| 2005/0270745 A1 | * | 12/2005 | Chen et al. | 361/707 |
| 2005/0276082 A1 | * | 12/2005 | Panda et al. | 363/70 |

FOREIGN PATENT DOCUMENTS

| | | |
|---|---|---|
| CN | 101447740 A | 6/2009 |
| CN | 101752998 A | 6/2010 |
| CN | 201674457 U | 12/2010 |
| CN | 201708701 U | 1/2011 |
| TW | 322611 | 11/2007 |

* cited by examiner

*Primary Examiner* — Adolf Berhane
*Assistant Examiner* — Nusrat Quddus
(74) *Attorney, Agent, or Firm* — CKC & Partners Co., Ltd.

(57) ABSTRACT

The present invention provides a high-power medium-voltage drive power cell, which comprises: a rectifier module for rectifying the three-phase AC input voltage to get a DC voltage; an IGBT (Insulated Gate Bipolar Transistor) inverter bridge connected to capacitors for converting the DC voltage into an AC voltage of which the frequency, the amplitude and the phase are adjustable; a bypass module connected to the IGBT inverter bridge for providing the bypass function when the IGBT inverter bridge works in an abnormal state; and a heat pipe heat sink having a base plate on both sides of which power elements of the high-power medium-voltage drive power cell are disposed.

9 Claims, 5 Drawing Sheets

HIGH-POWER MEDIUM-VOLTAGE DRIVE POWER CELL HAVING POWER ELEMENTS DISPOSED ON BOTH SIDES OF BASE PLATE

RELATED APPLICATIONS

This application claims priority to Chinese Application Serial Number 201110318870.X, filed Oct. 19, 2011, which is herein incorporated by reference.

BACKGROUND

1. Field of Invention

The present invention relates to a variable frequency modulation technique with the power electronic devices. More particularly, the present invention relates to a high-power medium-voltage drive power cell.

2. Description of Related Art

With the rapid development of the modern power electronic technology and microelectronic technology, the medium-voltage high-power variable frequency control device has been used more and more widely, such as various wind generators, water pumps, compressors, rolling machines used in various industries such as petrochemical engineering, municipal water supply, ferrous metallurgy and electric energy.

In the prior art, a power cell with relatively independent functions is an important part of a cascaded medium-voltage drive, and is also a key part for performing the medium-voltage frequency control, which not only has to consider heat dissipation and ventilation, but also has to take in account various factors such as a compact structure, a proper layout, convenient assembly and maintenance.

Currently, most of the heat dissipation designs for the high-power medium-voltage drive adopt an aluminum extrusion heat sink, and all of the power elements are placed on the base of heat sink. This structure causes high heat dissipation requirements. When a large-scale heat sink is used, the distance between modules is relative large, and the layout is non-compact, which causes inconvenience for the electrical connections between the power elements and capacitors. Particularly, when each inverter bridge arm of an inverter bridge is formed from plural IGBTs (Insulated Gate Bipolar Transistors) connected in parallel, the heat dissipation requirements are much higher. Furthermore, the aluminum extrusion heat sink has a large volume and a heavy weight, and a high system cost.

In view of the above, those in the industry are endeavoring to find ways to design a novel high-power medium-voltage drive power cell, for effectively dissipating heat generated from each power element, and meanwhile obtaining a high-power medium-voltage drive power cell with more compactness, more reliable operation and more convenient maintenance.

SUMMARY

The present invention provides a novel high-power medium-voltage drive power cell.

A technical aspect of the present invention relates to a high-power medium-voltage drive power cell, which includes a power element subunit and a capacitor subunit. The power element subunit includes a rectifier module, an IGBT inverter bridge, a bypass module and a heat pipe heat sink. The rectifier module is used for rectifying a three-phase AC input voltage to get a DC voltage. The IGBT inverter bridge is electrically connected to the capacitors for converting the DC voltage into an AC voltage of which the frequency, amplitude and phase are adjustable. The bypass module is connected to the IGBT inverter bridge for providing a bypass function when the IGBT inverter bridge functions abnormally. The heat pipe heat sink has a base plate on both sides of which power elements of the high-power medium-voltage drive power cell are disposed. The capacitor subunit includes capacitors and a housing, and is electrically connected to the rectifier module and the IGBT inverter bridge, thereby filtering the rectified DC (direct current) voltage and then transferring the filtered DC voltage to the IGBT inverter bridge.

In the power element subunit, the IGBT inverter bridge is arranged at one side of the base plate of heat pipe heat sink, and the rectifier module and bypass module are arranged at the other side of the base plate of heat pipe heat sink.

The base plate of the heat pipe heat sink includes an air inlet end and an air outlet end. The rectifier module is located at the air inlet end, and the bypass module is located at the air outlet end.

In an embodiment, the IGBT inverter bridge includes two bridge arms, and each bridge arm has plural IGBTs connected in parallel.

The capacitor subunit and the IGBT inverter bridge are arranged adjacent to each other, so as to shorten an electrical energy transfer distance and thus reduce circuit stray inductances. The IGBT inverter bridge further includes an IGBT bus, and the capacitor subunit further includes a capacitor bus. The IGBTs and the capacitors are electrically connected via the IGBT bus and the capacitor bus. The capacitor subunit is dismantably secured and connected to the power element subunit. The power cell connected in this manner can be disassembled into two independent subunits simply and conveniently. The two independent subunits are of substantially equal weight, which are about one half of the weight of the overall power cell. The two subunits are connected only by several screws, and thus are easy to be dismantled or assembled, thereby enabling the power cell to be manufactured, installed, maintained and dismantled more conveniently.

The high-power medium-voltage drive power cell further includes a control module, and sheet metal parts are arranged around printed circuit boards corresponding to the control module, thereby enclosing the printed circuit board and thus implementing electromagnetic shielding.

By using the high-power medium-voltage drive power cell of the present invention, power elements of the respective functional modules (the rectifier module, the inverter module and the bypass module) are respectively arranged at two sides of the base plate of the heat pipe heat sink. Thus, not only could the excellent thermal conductance of the heat pipe heat sink be applied to improve the heat dissipation efficiency of the system, but also the power elements could be gathered to get a more compact structure. Moreover, placing the rectifier module at the air inlet side of the base plate could facilitate fast heat dissipation, so as to decrease the operation temperatures of the power elements. Additionally, the capacitor subunit and the IGBT inverter bridge are arranged adjacent to each other, and are electrically connected by respective buses, thereby significantly reducing circuit stray inductances.

BRIEF DESCRIPTION OF THE DRAWINGS

Various aspects of the present invention can be more clearly understood after reading the following specific embodiments, with reference to the accompanying drawings. In the drawings.

DETAILED DESCRIPTION

Figure 1:
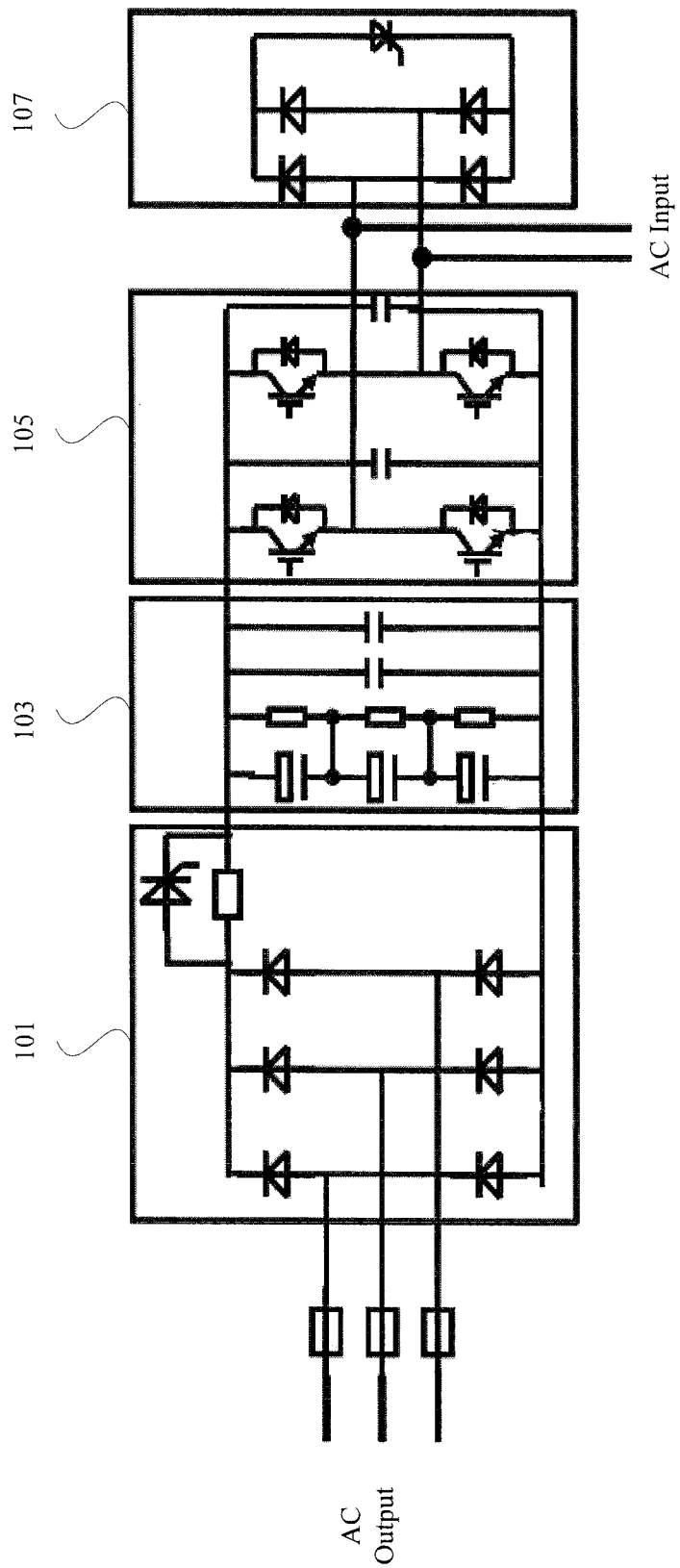
FIG. 1 illustrates a schematic circuit structure diagram of a high-power medium-voltage drive power cell according to an embodiment of the present invention.

Specific embodiments of the present invention are further described in detail below with reference to the accompanying drawings.

In order to make the description of the present invention more detailed and more comprehensive, various embodiments are described below with reference to the accompanying drawings. The same reference numbers are used in the drawings referring to the same or like elements. However, the embodiments described are not intended to limit the present invention. Moreover, it is not intended for the description of operation to limit the scope of implementation. Any device with equivalent functions that is produced from a structure formed by a recombination of elements shall fall within the scope of the present invention.

The drawings are only illustrative and are not drawn according to actual size. Additionally, well-known elements and steps are not described in the embodiments to avoid causing unnecessary limitations to the present invention.

As described above, in most of the conventional heat dissipation designs of the high-power medium-voltage drive adopt an aluminum extrusion heat sink, which has a large volume, a great weight and a high cost, is adopted, and all of the power elements are placed on the heat sink. When such a heat sink is used, the distances between adjacent power elements are large and the layout is non-compact, which easily causes the increase of stray inductances on the electrical connection lines between the power elements and the capacitors. In order to solve this disadvantage effectively, FIG. 1 illustrates a schematic circuit structure diagram of a high-power medium-voltage drive power cell according to an embodiment of the present invention. Referring to FIG. 1, the high-power medium-voltage drive power cell includes a rectifier module 101, capacitors 103, an IGBT inverter bridge 105, a bypass module 107 and a heat pipe heat sink (not shown). The combination of the rectifier module 101, the IGBT inverter bridge 105, the bypass module 107 and the heat pipe heat sink is referred to as a power element subunit. The capacitors 103, their housing and so on are referred to a capacitor subunit.

Particularly, the rectifier module 101 is used for rectifying a three-phase AC input voltage, so as to convert the AC input into a DC voltage. Furthermore, for performing the precharge function, a fuse may be arranged between an AC input end of an inverter and the rectifier module 101, so as to perform a shutoff protection on a circuit when a current of the circuit is higher than the rated current of the fuse. The capacitors 103 are electrically connected to the rectifier module 101, thereby filtering the rectified DC voltage and then transferring the filtered DC voltage to the IGBT inverter bridge 105.

The IGBT inverter bridge 105 is electrically connected to the capacitors for converting the DC voltage into an AC voltage having an adjustable frequency, an adjustable amplitude and an adjustable phase. It should be pointed out that when the IGBT inverter bridge 105 is electrically connected to the capacitors 103, the electrical routing distance between the IGBTs of each bridge arm of the IGBT inverter bridge 105 and the capacitors 103 should be arranged to be as short as possible, so as to avoid the increase of stray inductance on the connection line between the IGBTs and the capacitors, thereby facilitating the assurance of the circuit reliability and operation stability. Additionally, in order to improve the withstand voltage or the system current of the IGBT inverter bridge 105, plural IGBTs connected in series or parallel may be used. When the IGBTs are connected in series or parallel, the heat dissipation specification of the heat sink should be adjusted appropriately, so as to meet the requirements of higher heat dissipation ability and temperature consistency.

The bypass module 107 is connected to the IGBT inverter bridge 105 for providing the bypass function when the IGBT inverter bridge 105 functions abnormally. For example, when the IGBT inverter bridge functions abnormally, the bypass module 107 can be thrown into the main circuit, so as to provide a path for the system energy, thereby ensuring the normal operation of the drive. In a specific embodiment, when the rectifier module 101 and the IGBT inverter bridge 105 are functioning normally or are recovered to a normal state from a failed state, the bypass module does not work or is thrown out of the main circuit. When the rectifier module 101 and the IGBT inverter bridge 105 are changed to the failed state from the normal state, the bypass module is thrown into the main circuit and starts to work, and at this time, the rectifier module 101 and the IGBT inverter bridge 105 do not work.

The high-power medium-voltage drive of the present invention further includes a heat pipe heat sink (not shown). The heat pipe heat sink has a base plate on both sides of which power elements of the inverter are disposed. Different from the prior art, the power elements of the present invention are respectively arranged at two sides of the base plate of the heat pipe heat sink, so that the layout space can be reduced by at least 20% under the case of the same number of power elements. Furthermore, when the power elements are being arranged, it can be emphasized to make the electrical connection distance between the capacitors and the IGBTs of the IGBT inverter bridge as short as possible, so as to reduce circuit stray inductances.

In an embodiment, the IGBT inverter bridge includes two bridge arms, and each bridge arm has plural IGBTs connected in parallel. Preferably, the IGBT inverter bridge includes a first bridge arm and a second bridge arm, and in the first bridge arm, a node at which the IGBTs are intersected is electrically connected to a first terminal of the AC output end of the inverter, and in the second bridge arm, a node at which the IGBTs are intersected is electrically connected to a second terminal of the AC output end of the inverter. Meanwhile, the node of the first bridge arm and the node of the second bridge arm are connected to the bypass module 107, so as to provide the bypass function. Preferably, in order to increase the current value of the power cell, the bridge arm of the inverter bridge are formed from 4 IGBTs connected in parallel, and the control signals of the IGBTs come from the same control signal.

In another embodiment, the rectifier module 101 is a three-phase uncontrolled rectifier bridge.

In still another embodiment, the bypass module 107 is formed from a single-phase uncontrolled rectifier bridge and a thyristor.

Figure 2A:
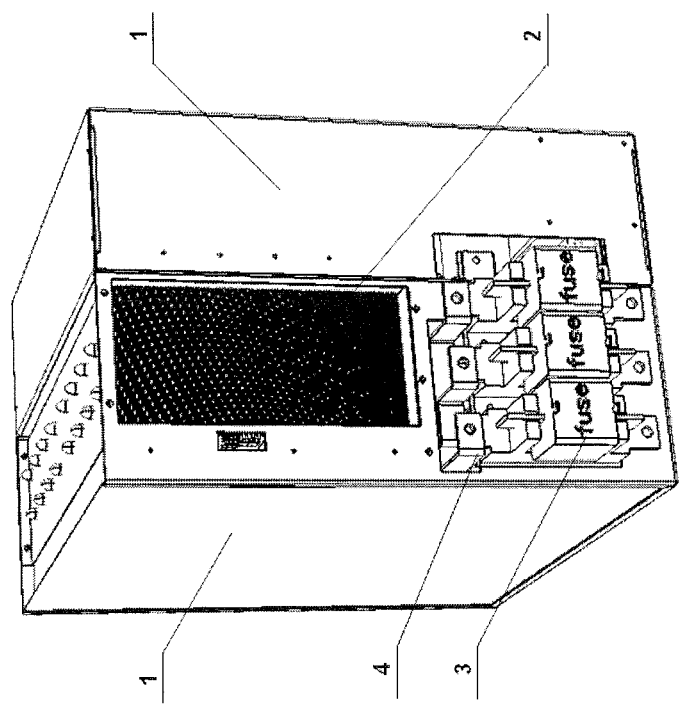
FIG. 2A illustrates a 3-D diagram showing an assembly state of the high-power medium-voltage drive power cell in FIG. 1 when a housing is assembled.
Figure 2B:
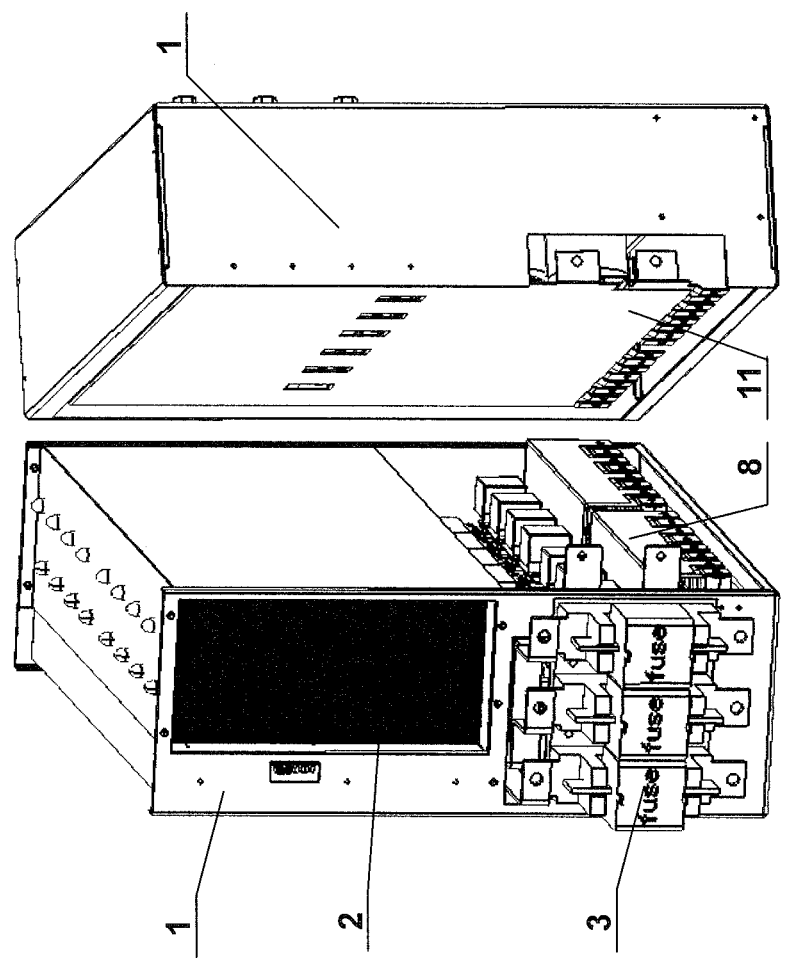
FIG. 2B illustrates a disassembled view of the capacitor subunit and the power element subunit in FIG. 1.
Figure 2C:
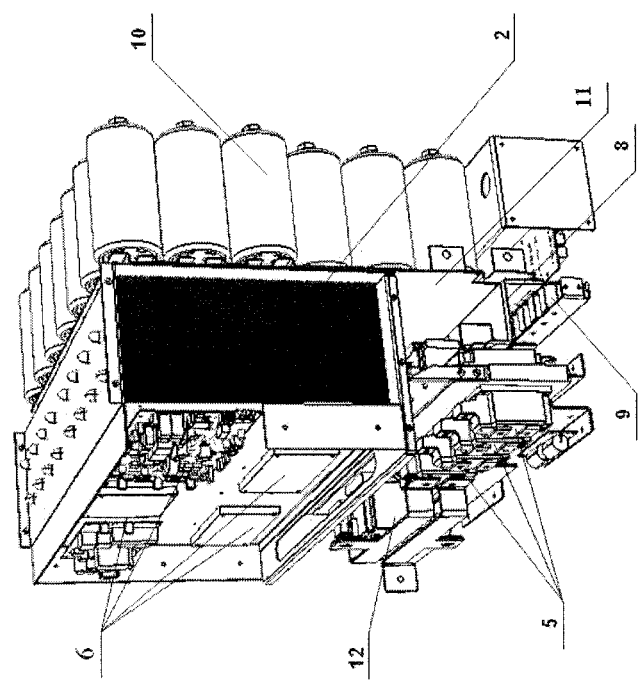
FIG. 2C illustrates a 3-D diagram showing an assembly state of the high-power medium-voltage drive power cell in FIG. 1 when the housing is removed.

FIG. 2A illustrates a 3-D diagram showing an assembly state of the high-power medium-voltage drive power cell in FIG. 1 when a housing is assembled. FIG. 2B illustrates a disassembled view of the capacitor subunit and the power element subunit in FIG. 1. FIG. 2C illustrates a 3-D diagram showing an assembly state of the high-power medium-voltage drive power cell in FIG. 1 when the housing is removed. Referring to FIGS. 2A-2C, reference number "1" represents a housing, reference number "2" represents a heat pipe heat sink; reference number "3" represents a fuse; reference number "4" represents an input copper busbar; reference number "5" represents the rectifier module, reference number "6" represents a control module, reference number "9" represents an insulator; reference number "10" represents capacitors; reference number "11" represents a capacitor bus; and reference number "12" represents the bypass module. It should be understood that the rectifier module 5, the capacitors 10, the IGBT inverter bridge 7 and the bypass module 12 in FIGS. 2A and 2C are the same or similar to the rectifier module 101, the capacitors 103, the IGBT inverter bridge 105 and the bypass module 107 in FIG. 1. For convenience of description, no further description will be given here, and the contents are incorporated herein by reference.

As shown in FIGS. 2A and 2C, the three-phase AC input is connected to the rectifier module 5 through the fuse 3, and subsequently the DC voltage outputted by the rectifier module 5 is delivered to the capacitors 10 via the capacitor bus 11. The high-power medium-voltage drive power cell of the present invention includes the rectifier module 5, the IGBT inverter bridge 7, the bypass module 12 and the heat pipe heat sink 2. When the base plate of the heat pipe heat sink 2 is placed in a vertical direction, the rectifier module 5 and the bypass module 12 are placed at the left side of the base plate, and the IGBT inverter bridge 7 is placed at the right side of the base plate. Moreover, since the IGBT inverter bridge 7 works in high frequency, and the rectifier module 5 and the bypass module 12 work with a low frequency, in the case the IGBT inverter bridge, the rectifier module and the bypass module are respectively placed at both sides of the base plate, the interference of the high-frequency signal to the low-frequency signal may be effectively prevented. Additionally, the insulator 9 is installed at the bottom of the drive power cell, so as to electrically isolate the electric potential of electric components of the drive power cell and the electric potential of the housing, and to resist voltage and certain mechanical stress.

In a specific embodiment, the base plate includes an air inlet end (also referred to as a windward side) and an air outlet end (also referred to as a leeward side). The rectifier module 5 is placed at the air inlet end of the base plate, and the bypass module 12 is placed at the air outlet end of the base plate. This is because when the drive is operated in a normal state, the rectifier module and the IGBT inverter bridge work normally, and the bypass module does not work. By using such a setup, the rectifier module requiring more heat dissipation can be flexibly located at the air inlet end, so as to reduce the working temperature of the rectifier diode and ensure the overall circuit operation reliability and stability.

In another specific embodiment, the capacitors are formed from plural electrolytic capacitors connected in parallel. For example, different electrolytic capacitors are connected in series or/and in parallel via the capacitor bus.

In still another embodiment, the IGBT inverter bridge 7 and the capacitor subunit 10 arranged at the other side of the base plate are arranged adjacent to each other, so as to shorten the electric energy transfer distance and thus reduce circuit stray inductances.

Additionally, the high-power medium-voltage drive further includes a control module 6. Several sheet metal parts are arranged around the printed circuit boards corresponding to the control module 6, and only the spaces for inlet wires and outlet wires are reserved. By enclosing the printed circuit boards, the control module 6 may function normally under a severe electromagnetic interference.

Figure 3:
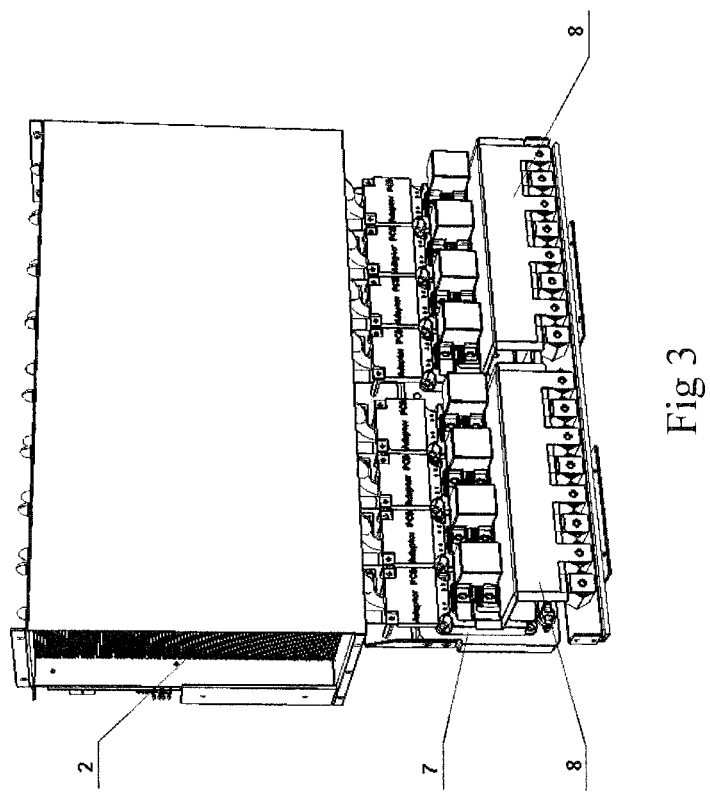
FIG. 3 illustrates a schematic layout view of the IGBT of the high-power medium-voltage drive power cell in FIG. 1.

FIG. 3 illustrates a schematic layout view of the IGBT of the high-power medium-voltage drive power cell in FIG. 1. Referring to FIG. 3, the high-power medium-voltage drive power cell further includes an IGBT bus 8 and a capacitor bus 11. The IGBTs of the IGBT inverter bridge 7 and the capacitors of the capacitor subunit 10 are electrically connected via the IGBT bus 8 and the capacitor bus 11. Therefore, the electrical connection distance between the IGBTs and the capacitors is short, thereby significantly reducing circuit stray inductances, thereby improving the circuit reliability and stability.

In an embodiment, in order to maintain or replace the power elements more conveniently, the capacitor subunit is dismantably secured and connected to the power element subunit. The power cell connected in this manner can be dismantled into two independent subunits simply and conveniently. The two independent subunits have substantially equal weights, which are about one half of the overall power cell weight. The two subunits are connected merely by several screws, and thus may be easy to be dismantled or assembled, which enabling the power cell to be manufactured, assembled, maintained and dismantled more conveniently.

By using the high-power medium-voltage drive power cell of the present invention, power elements of its respective functional modules (the rectifier module, the inverter module and the bypass module) are respectively arranged at both sides of the base plate of the heat pipe heat sink. Thus, not only could the excellent thermal conductance of the heat pipe heat sink be used to improve the system heat dissipation efficiency, but also the power elements could be gathered to get a more compact structure. Moreover, placing the rectifier module at the air inlet side of the base plate may facilitate fast heat dissipation, so as to decrease the operation temperature of the power elements. Additionally, the capacitors and the IGBT inverter bridge are arranged adjacent to each other, and are electrically connected by respective bus, thereby significantly reducing circuit stray inductances.

Although the present invention has been disclosed with reference to the above embodiments, these embodiments are not intended to limit the present invention. It will be apparent to those of skills in the art that various modifications and variations can be made without departing from the spirit or scope of the present invention. Therefore, the scope of the present invention shall be defined by the appended claims.

What is claimed is:

1. A high-power medium-voltage drive power cell, comprising:
   a power element subunit, comprising:
      a rectifier module for rectifying a three-phase AC input voltage to obtain a DC voltage;
      an IGBT (Insulated Gate Bipolar Transistor) inverter bridge electrically connected to a capacitor subunit for converting the DC voltage into an AC voltage of which the frequency, the amplitude and the phase are adjustable;
      a bypass module connected to the IGBT inverter bridge for providing the bypass function when the IGBT inverter bridge functions abnormally; and a heat pipe heat sink having a base plate on both sides of which power elements of the high-power medium-voltage drive power cell are disposed; and a capacitor subunit comprising capacitors and a housing, wherein the capacitor subunit is electrically connected to the rectifier module and the IGBT inverter bridge, thereby filtering the DC voltage rectified and then transferring the DC voltage filtered to the IGBT inverter bridge, wherein in the power element subunit, the IGBT inverter bridge is arranged at one side of the base plate, and the rectifier module and the bypass module are arranged at the other side of the base plate, wherein the power element subunit and the capacitor subunit have substantially equal weights, which are about one half of the overall power cell weight.

2. The high-power medium-voltage drive power cell of claim 1, wherein the base plate comprises an air inlet end and an air outlet end; the rectifier module is located at the air inlet end; and the bypass module is located at the air outlet end.

3. The high-power medium-voltage drive power cell of claim 1, wherein the IGBT inverter bridge comprises two bridge arms, and each of the bridge arms has a plurality of IGBTs connected in parallel.

4. The high-power medium-voltage drive power cell of claim 1, wherein the capacitor subunit and the IGBT inverter bridge are arranged adjacent to each other, so as to shorten an electrical energy transfer distance and thus reduce circuit stray inductances.

5. The high-power medium-voltage drive power cell of claim 4, wherein the IGBT inverter bridge further comprises an IGBT bus; the capacitor subunit further comprises a capacitor bus; and the IGBTs and the capacitors are electrically connected via the IGBT bus and the capacitor bus.

6. The high-power medium-voltage drive power cell of claim 4, wherein the capacitor subunit is dismantably secured and connected to the power element subunit.

7. The high-power medium-voltage drive power cell of claim 1, further comprising a control module, wherein several sheet metal parts are arranged around printed circuit boards corresponding to the control module, thereby enclosing the printed circuit boards and implementing electromagnetic shielding.

8. A high-power medium-voltage drive power cell, comprising:
a power element subunit, comprising:
a rectifier module for rectifying a three-phase AC input voltage to obtain a DC voltage;
an IGBT (Insulated Gate Bipolar Transistor) inverter bridge electrically connected to a capacitor subunit for converting the DC voltage into an AC voltage of which the frequency, the amplitude and the phase are adjustable;
a bypass module connected to the IGBT inverter bridge for providing the bypass function when the IGBT inverter bridge functions abnormally; and
a heat pipe heat sink having a base plate on both sides of which power elements of the high-power medium-voltage drive power cell are disposed; and
a capacitor subunit comprising capacitors and a housing, wherein the capacitor subunit is electrically connected to the rectifier module and the IGBT inverter bridge, thereby filtering the DC voltage rectified and then transferring the DC voltage filtered to the IGBT inverter bridge,
wherein the base plate comprises an air inlet end and an air outlet end; the rectifier module is located at the air inlet end; and the bypass module is located at the air outlet end.

9. A high-power medium-voltage drive power cell, comprising:
a power element subunit, comprising:
a rectifier module for rectifying a three-phase AC input voltage to obtain a DC voltage;
an IGBT (Insulated Gate Bipolar Transistor) inverter bridge electrically connected to a capacitor subunit for converting the DC voltage into an AC voltage of which the frequency, the amplitude and the phase are adjustable;
a bypass module connected to the IGBT inverter bridge for providing the bypass function when the IGBT inverter bridge functions abnormally; and
a heat pipe heat sink having a base plate on both sides of which power elements of the high-power medium-voltage drive power cell are disposed; and
a capacitor subunit comprising capacitors and a housing, wherein the capacitor subunit is electrically connected to the rectifier module and the IGBT inverter bridge, thereby filtering the DC voltage rectified and then transferring the DC voltage filtered to the IGBT inverter bridge,
wherein in the power element subunit, the IGBT inverter bridge is arranged at one side of the base plate, and the rectifier module and bypass module are arranged at the other side of the base plate,
wherein the base plate comprises an air inlet end and an air outlet end; the rectifier module is located at the air inlet end; and the bypass module is located at the air outlet end.

* * * * *